United States Patent
Saito et al.

(10) Patent No.: US 12,464,668 B2
(45) Date of Patent: Nov. 4, 2025

(54) ELECTRICAL CONTROL UNIT WITH SEALANT BETWEEN A COVER, A BASE, AND AN ELECTRICAL CONNECTOR

(71) Applicant: Hitachi Astemo, Ltd., Hitachinaka (JP)

(72) Inventors: Masato Saito, Hitachinaka (JP); Michihito Watarai, Hitachinaka (JP)

(73) Assignee: Hitachi Astemo, Ltd., Hitachinaka (JP)

(*) Notice: Subject to any disclaimer, the term of this patent is extended or adjusted under 35 U.S.C. 154(b) by 440 days.

(21) Appl. No.: 17/919,452

(22) PCT Filed: Feb. 2, 2021

(86) PCT No.: PCT/JP2021/003646
§ 371 (c)(1),
(2) Date: Oct. 17, 2022

(87) PCT Pub. No.: WO2021/215067
PCT Pub. Date: Oct. 28, 2021

(65) Prior Publication Data
US 2023/0156948 A1    May 18, 2023

(30) Foreign Application Priority Data
Apr. 21, 2020   (JP) ................................ 2020-075425

(51) Int. Cl.
*H05K 5/06*    (2006.01)
*B60R 16/02*   (2006.01)
(Continued)

(52) U.S. Cl.
CPC ............. *H05K 5/062* (2013.01); *B60R 16/02* (2013.01); *H01R 13/5202* (2013.01);
(Continued)

(58) Field of Classification Search
CPC .... H05K 5/062; H05K 5/0052; H05K 5/0069; H05K 5/0056; H05K 5/006;
(Continued)

(56) References Cited

U.S. PATENT DOCUMENTS 8,107,251 B2 * 1/2012 Yamauchi .............. H05K 5/061
                                                361/752
2009/0129035 A1   5/2009 Kojima
(Continued)

FOREIGN PATENT DOCUMENTS

JP         64-26885 U      2/1989
JP         S6426885 U  *   2/1989
(Continued)

OTHER PUBLICATIONS

International Search Report (PCT/ISA/210) issued in PCT Application No. PCT/JP2021/003646 dated Jun. 1, 2021 with English translation (six (6) pages).
(Continued)

Primary Examiner — Justin M Kratt
(74) Attorney, Agent, or Firm — Crowell & Moring LLP

(57) ABSTRACT

An object of the present invention is to provide an electronic control unit that curbs overflow of a sealant at a three-way junction of the sealant in the vicinity of a connector. The electronic control unit includes a first seal part 51 that seals between a base member 40 and a cover member 30, a second seal part 52 that seals between the base member 40 and a connector housing 20, and a third seal part 53 that is connected to the first seal part 51 and the second seal part 52 and seals between the cover member 30 and the connector housing 20. In a part (three-way junction) where the first seal part 51, the second seal part 52, and the third seal part 53 intersect, a space part 41JA1 that is connected to the
(Continued)

recessed part 41 and recessed further from a surface forming the recessed part 41 is formed.

6 Claims, 8 Drawing Sheets

(51) Int. Cl.
*H01R 13/52* (2006.01)
*H05K 5/00* (2006.01)
*H05K 5/02* (2006.01)

(52) U.S. Cl.
CPC ......... *H05K 5/0052* (2013.01); *H05K 5/0069* (2013.01); *H01R 13/52* (2013.01); *H05K 5/0056* (2013.01); *H05K 5/006* (2013.01); *H05K 5/0204* (2013.01); *H05K 5/061* (2013.01)

(58) Field of Classification Search
CPC ...... H05K 5/0204; H05K 5/061; B60R 16/02; H01R 13/5202; H01R 13/52
See application file for complete search history.

(56) References Cited

U.S. PATENT DOCUMENTS

| | | |
|---|---|---|
| 2009/0237896 A1 | 9/2009 | Yamauchi |
| 2013/0120943 A1 | 5/2013 | Tamura et al. |
| 2017/0112011 A1 | 4/2017 | Nuriya et al. |
| 2017/0257964 A1* | 9/2017 | Ishikawa ................ H05K 5/065 |

FOREIGN PATENT DOCUMENTS

| | | | |
|---|---|---|---|
| JP | 2009-123558 A | | 6/2009 |
| JP | 2009-230925 A | | 10/2009 |
| JP | 2013-168674 A | | 8/2013 |
| JP | 2014116504 A | * | 6/2014 |
| JP | 2016-143852 A | | 8/2016 |
| JP | 2017-4698 A | | 1/2017 |
| JP | 2017-76758 A | | 4/2017 |
| WO | WO 2016/031511 A1 | | 3/2016 |

OTHER PUBLICATIONS

Japanese-language Written Opinion (PCT/ISA/237) issued in PCT Application No. PCT/JP2021/003646 dated Jun. 1, 2021 (four (4) pages).

Japanese-language Office Action issued in Japanese Application No. 2022-516850 dated Oct. 17, 2023 with English translation (10 pages).

* cited by examiner

T1 < T2

ELECTRICAL CONTROL UNIT WITH SEALANT BETWEEN A COVER, A BASE, AND AN ELECTRICAL CONNECTOR

TECHNICAL FIELD

The present invention relates to a structure of an electronic control unit having a waterproof structure.

BACKGROUND ART

As a background art of the present technical field, a waterproof control unit described in JP 2017-76758 A (PTL 1) is known.

The waterproof control unit of PTL 1 includes a housing that hermetically houses a circuit board by a base, a cover, and a connector housing. The cover includes: a third seal recessed surface part forming a third seal gap with the base; a first seal recessed surface part provided in a trapezoidal oblique side part on the cover side in a first seal gap between the cover and three sides of a trapezoid of the connector housing having a trapezoidal end surface; and a replenishment inclined surface part which is a part of the trapezoidal oblique side part. As a result, in the waterproof control unit of PTL 1, when the connector housing is installed after a waterproof sealing material is applied to a first seal gap surface, the waterproof sealing material is prevented from being scraped off and becoming thin by being replenished with the waterproof sealing material applied to the replenishment inclined surface part (see Abstract).

CITATION LIST

Patent Literature

PTL 1: JP 2017-76758 A

SUMMARY OF INVENTION

Technical Problem

In an electronic control unit having a right angle connector in which the connection direction is parallel to a board surface as in the waterproof control unit (hereinafter, referred to as an electronic control unit) of PTL 1, three seal parts, that is, a "connector lower seal part" and a "connector upper seal part" for waterproofing the periphery of the connector, and an "outer peripheral seal part" for waterproofing a part between the cover other than the connector part and the base, are required. Therefore, a three-way junction of the sealant is formed in a part where the three seal parts intersect in the vicinity of the connector.

In the three-way junction of the sealant, due to the application locus of the sealant, twice or more application of the sealant cannot be avoided, and the application amount of the sealant becomes excessive. Therefore, in the three-way junction of the sealant, there is a problem that an overflow amount of the sealant after the base, the connector housing, and the cover are assembled increases.

In the electronic control unit described in PTL 1, although consideration is given to preventing the sealant (waterproof sealing material) from being scraped off and becoming thin when the connector housing is installed by replenishing with the waterproof sealing material applied to the replenishment inclined surface part, consideration is not given to curbing overflow of the sealant at the three-way junction of the sealant.

An object of the present invention is to provide an electronic control unit that curbs overflow of a sealant at a three-way junction of the sealant in the vicinity of a connector.

Solution to Problem

In order to achieve the above object, an electronic control unit of the present invention is an electronic control unit including: a base member that has a recessed part on an outer periphery and an accommodation space for an electronic circuit board formed inside the recessed part; a cover member that covers the electronic circuit board and is attached to the base member; a connector housing that has a connector and is at least partially accommodated between the base member and the cover member; a first seal part that is provided in the recessed part and seals between the base member and the cover member; a second seal part that is provided in the recessed part and seals between the base member and the connector housing; and a third seal part that is connected to the first seal part and the second seal part and seals between the cover member and the connector housing, in which a space part connected to the recessed part and recessed further from a surface forming the recessed part is formed in a part where the first seal part, the second seal part, and the third seal part intersect.

Advantageous Effects of Invention

According to the present invention, it is possible to curb overflow of a sealant at a three-way junction of the sealant in the vicinity of a connector of an electronic control unit.

Problems, configurations, and effects other than those described above will be clarified by the following description of embodiments.

DESCRIPTION OF EMBODIMENTS

An electronic control unit according to the present invention has a waterproof structure and is particularly suitable for use in a vehicle. Hereinafter, an electronic control unit (ECU) mounted in an engine room will be described.

Figure 1:
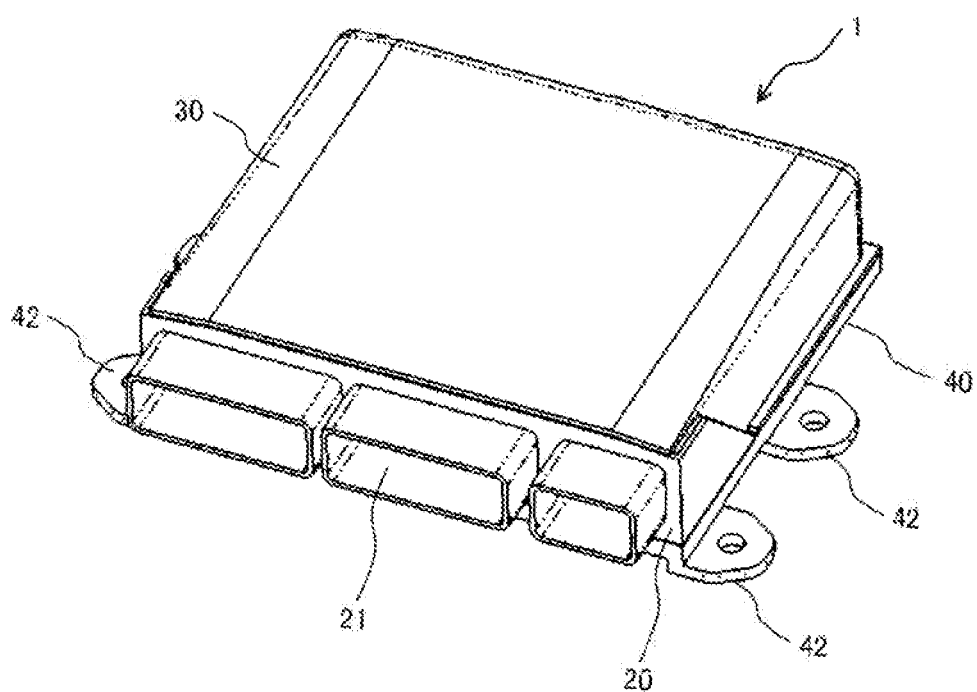
FIG. 1 is a perspective view illustrating an appearance according to an embodiment of an electronic control unit of the present invention.
Figure 2:
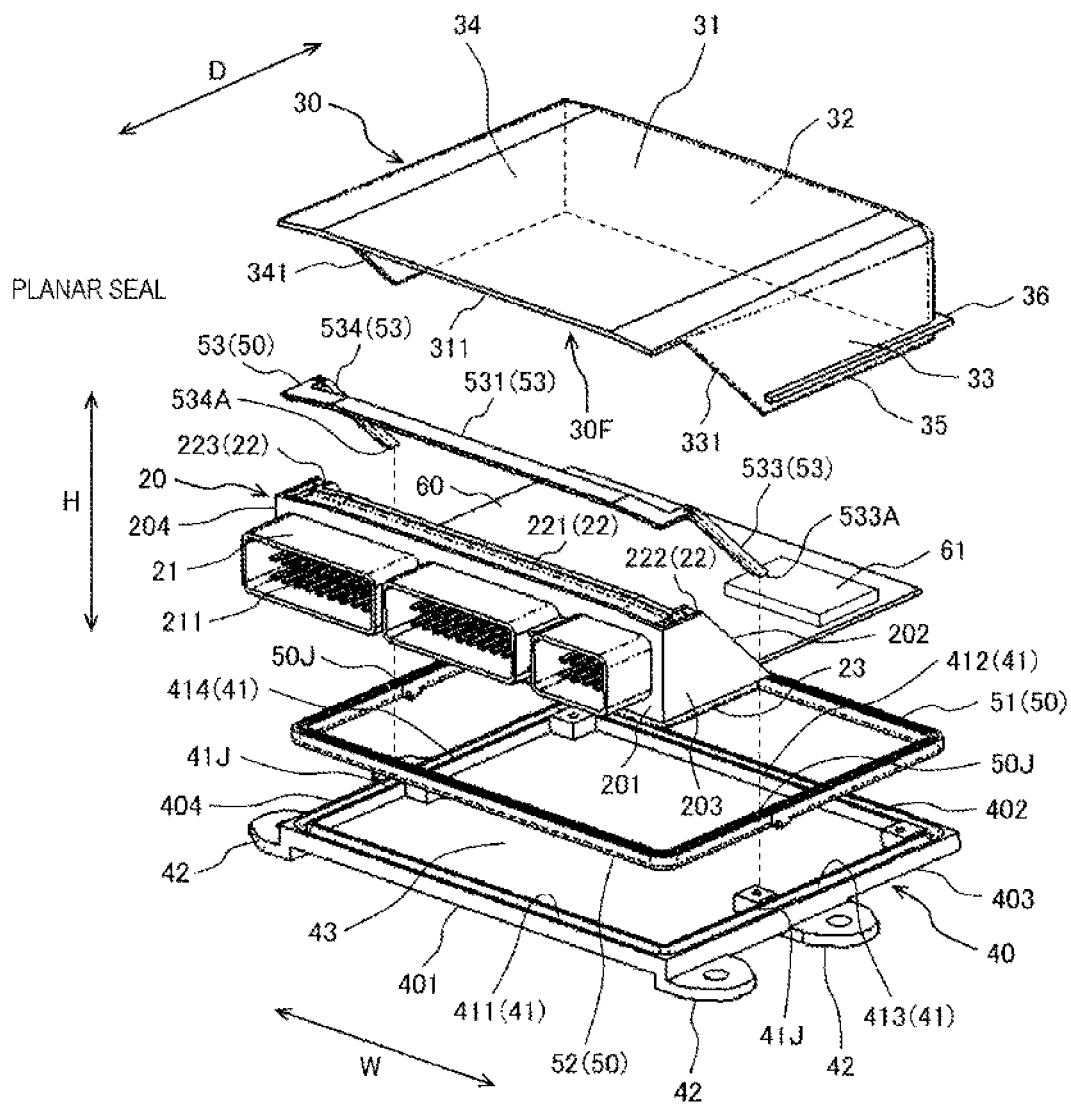
FIG. 2 is a development (exploded three-dimensional view) of the electronic control unit of FIG. 1.
Figure 3:
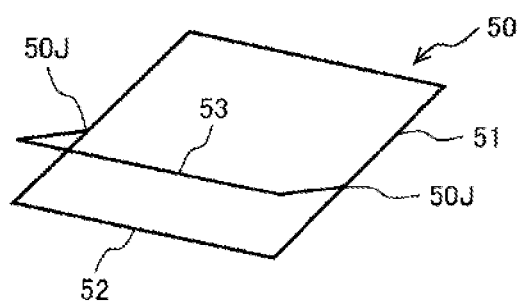
FIG. 3 is a schematic view illustrating an application locus of a sealant according to a first embodiment of the present invention.

An embodiment of the electronic control unit according to the present invention will be described with reference to FIGS. 1 to 3. FIG. 1 is a perspective view illustrating an appearance according to an embodiment of an electronic control unit 1 of the present invention. FIG. 2 is a development (exploded three-dimensional view) of the electronic control unit 1 of FIG. 1. FIG. 3 is a schematic view illustrating an application locus of a sealant 50 according to a first embodiment of the present invention.

In the description of the present embodiment, a height direction H, a width direction W, and a depth direction D are defined based on FIG. 2. The height direction H is along the vertical direction (vertical direction), and the width direction W and the depth direction D are along the horizontal direction (lateral direction). In the description of the present embodiment, the vertical direction (vertical direction) and the horizontal direction (lateral direction) are defined on the basis of FIG. 2, and do not define directions in the mounted state of the electronic control unit 1.

As illustrated in FIGS. 1 and 2, the electronic control unit 1 according to the present invention includes a connector 21 connected to a vehicle harness side, an electronic circuit board 60 on which an electronic component 61 is mounted, a cover (cover member) 30 and a base (base member) 40 for housing the connector 21 and the electronic circuit board 60, and a sealing material 50 provided in a boundary part between the connector 21, the cover 30, and the base 40.

The cover (cover member) 30 covers the electronic circuit board 60 and is attached to the base (base member) 40.

The cover 30 has a substantially rectangular shape when viewed in the vertical direction, and includes a top surface 31 that is the highest surface of the electronic control unit 1 and three side walls 32, 33, and 34 surrounding the electronic control unit 1. The side walls 32, 33, and 34 are continuously provided so as to surround three side surfaces of the electronic control unit 1, the side wall 32 forms a side wall on the back surface side of the electronic control unit 1, and the side walls 33 and 34 form side walls on both side surface sides in the width direction W of the electronic control unit 1.

A front surface 30F side of the cover 30 is open, and this open part is surrounded by a front edge 311 of the top surface 31 and front edges 331 and 341 of the side walls 33 and 34. The front edge 311 of the top surface 31 is along the lateral direction, and the front edges 331 and 341 of the side walls 33 and 34 are along the height direction. Further, the front edges 331 and 341 are inclined so as to retract toward the back surface (side wall 32) side from the top surface 31 side toward the base 40 side.

The side walls 32, 33, and 34 of the cover 30 are provided a flange parts 36 protruding laterally (laterally outward) in a position closer to the top surface 31 than a lower end part (lower edge part) 35 of the cover 30. The flange part 36 is provided in the vicinity of the lower end part 35 of the cover 30.

The cover 30 is formed of resin such as polybutylene terephthalate (PBT), polyphenylene sulfide (PPS), and nylon (PA), or metal containing aluminum, iron, or the like as a main component.

A connector housing 20 has a front surface 201 substantially perpendicular to the top surface 31 of the cover 30, and has a plurality of connectors 21 on the front surface 201. Side surfaces 203 and 204 of the connector housing 20 have a substantially trapezoidal shape. Therefore, a rear part 202 of the connector housing 20 is inclined so as to protrude toward the back surface (side wall 32) side from the upper surface side toward the lower surface side.

The connector housing 20 is inclined such that the rear part 202 extends along the inclination of the front edges 331 and 341 of the side walls 33 and 34 of the cover 30, and is fitted to the open part of the front surface 30F of the cover 30 when the cover 30 is assembled.

In addition, the connector housing 20 has a protruding part 23 protruding downward (toward base 40) in a lower surface part thereof. The protruding part 23 is provided inside the front surface 201 and the side surfaces 203 and 204 along the front surface 201 and the side surfaces 203 and 204.

The connector housing 20 has the connector 21, and at least a part of the connector housing 20 is accommodated between the base member 40 and the cover member 30. In this case, the front surface 201 and both side surfaces 203 and 204 of the connector housing 20 are exposed to the outside of the base member 40 and the cover member 30.

The connector housing 20 including the connector 21 is formed of resin such as polybutylene terephthalate (PBT), polyamide (PA), or polyphenylene sulfide (PPS). That is, the connector 21 is integrally formed of the same resin material as that of the connector housing 20. The connector 21 includes a plurality of connector terminals 211 made of metal containing copper as a main component.

The connector terminal 211 exchanges voltage and current between the electronic control unit 1 and an external device. The connector terminal 211 is electrically connected to the electronic circuit board 60 by soldering, press-fitting, or the like.

The electronic circuit board 60 is fixed to the connector housing 20 and integrated with the connector housing 20. The connector 21 is formed of a right angle connector 21 whose connection direction is parallel to a board surface of the electronic circuit board 60 (mounting surface of electronic component 61).

The connector housing 20 has a seal groove 22. The seal groove 22 includes a seal groove part (connector upper seal groove part) 221 formed on the upper side of the connector 21 and seal groove parts (connector side seal groove parts) 222 and 223 formed in both end parts (both side parts) in the width direction W of the connector housing 20. The seal groove parts 222 and 223 are formed so as to connect an upper part and a lower part of the connector housing 20, and are inclined so as to protrude rearward (toward back surface 32) from the upper part side to the lower part side of the connector housing 20. That is, the seal groove parts 222 and 223 are inclined along the inclination of the front edges 331 and 341 of the side surfaces 33 and 34 of the cover 30.

The seal groove part (connector upper seal groove part) 221 and the seal groove parts (connector side seal groove parts) 222 and 223 form one communicating seal groove 22.

The base 40 has four sides 401, 402, 403, and 404, and has a substantially rectangular shape when viewed in the vertical direction. The side 401 forms a side on the front surface side. The side 402 forms a side on the back surface side. The sides 403 and 404 form sides on both sides in the width direction W. The base 40 includes a plurality of mounting brackets 42 protruding laterally (outward in width direction W) from the sides 403 and 404.

The base (base member) 40 has a seal groove (recessed part) 41 on the outer periphery thereof, and an accommodation space (bottom surface part) 43 of the electronic circuit board 60 is formed inside the seal groove 41.

The seal groove 41 is formed along the four sides 401, 402, 403, and 404 of the base 40 so as to surround the central bottom surface part 43 of the base 40. The seal groove 41 includes a seal groove part 411 formed along the side 401, a seal groove part 412 formed along the side 402, a seal groove part 413 formed along the side 403, and a seal groove part 414 formed along the side 404. The four seal groove parts 411, 412, 413, and 414 form one communicating seal groove 41.

The base 40 is formed of resin such as polybutylene terephthalate (PBT), polyphenylene sulfide (PPS), and nylon (PA), or metal containing aluminum, iron, or the like as a main component.

The connector housing 20 has a seal structure part including the seal groove 22 (221, 222, and 223) and the protruding part 23. The cover 30 has a seal structure part including an inner surface part along the front edge 311 of the top surface 31, the front edges 331 and 341 of the side walls 33 and 34 of the cover 30, and the lower end part (lower edge) 35 of the cover 30. The base 40 has a seal structure part formed of the seal groove 41 (411, 412, 413, and 414).

As illustrated in FIG. 2, when the connector housing 20 and the base 40 are assembled, the protruding part 23 of the connector housing 20 is inserted into the seal groove parts 411, 413, and 414 of the seal groove 41 of the base 40, whereby the seal structure part of the connector housing 20 and the seal structure part of the base 40 are combined. When the connector housing 20 and the cover 30 are assembled, the front edges 331 and 341 of the side walls 33 and 34 of the cover 30 are inserted into the seal groove parts 222 and 223 of the seal groove 22 of the connector housing 20, and the inner surface part along the front edge 311 of the top surface 31 faces the seal groove part 221, whereby the seal structure part of the connector housing 20 and the seal structure part of the cover 30 are combined. When the cover 30 and the base 40 are assembled, the lower end part (lower edge) 35 of the cover 30 is inserted into the seal groove parts 412, 413, and 414 of the seal groove 41 of the base 40, whereby the seal structure part of the cover 30 and the seal structure part of the base 40 are combined. In this case, the waterproof property of the electronic control unit 1 is secured by applying the sealant forming the sealing material 50 to each seal structure part.

As illustrated in FIGS. 2 and 3, the sealing material 50 includes three seal parts of a first seal part (outer peripheral seal part) 51 for waterproofing between the cover 30 other than the connector part and the base, and a second seal part (connector lower seal part) 52 and a third seal part (connector upper seal part) 53 for waterproofing the periphery of the connector housing 20.

That is, the first seal part 51 is provided in the recessed part 41 and seals between the base member 40 and the cover member 30. In addition, the second seal part 52 is provided in the recessed part 41 and seals between the base member 40 and the connector housing 20. Further, the third seal part 53 is connected to the first seal part 51 and the second seal part 52 to seal between the cover member 30 and the connector housing 20.

A three-way junction (intersection) 50J of the sealing material 50 is formed in a part where the three seal parts 51, 52, and 53 intersect.

In the present embodiment, the electronic control unit 1 has a rectangular shape when viewed in the vertical direction H, and parts (three-way junctions) 50J where the first seal part 51, the second seal part 52, and the third seal part 53 intersect are provided on two surfaces on both sides of the surface on which the connector 21 is mounted among the four side surfaces of the outer periphery of the electronic control unit 1. These two surfaces are surfaces corresponding to the sides 403 and 404 of the base 40.

The sealing material 50 is formed by applying a liquid sealant to the seal groove 41 and then solidifying the sealant. In the description of the present specification, reference numeral 50 may be used for a sealing material (seal part), and reference numeral 50 may also be used for a liquid sealant.

The seal groove 41 has a function of holding the sealant. The first seal part 51 and the second seal part 52 are formed in the seal groove part 41, and the third seal part 53 is formed in the seal groove 22. A three-way junction (intersection) 41J of the seal grooves 22 and 41 is formed in a part where the seal groove 22 intersects with the seal groove part 41. The three-way junction 50J of the sealing material 50 is formed in the three-way junction 41J of the seal grooves 22 and 41.

The three-way junction (intersection) 41J of the seal grooves 22 and 41 is formed in the seal groove part 413 and the seal groove part 414. The first seal part 51 is formed across the seal groove part 412, the seal groove part 413, and the seal groove part 414. In this case, the first seal part 51 is formed in a part of the seal groove part 413 and the seal groove part 414 on the back surface side (seal groove part 412 side) of the three-way junction 41J. The second seal part 52 is formed across the seal groove part 411, the seal groove part 413, and the seal groove part 414. The second seal part 52 is formed in a part of the seal groove part 413 and the seal groove part 414 on the front surface side (seal groove part 411 side) of the three-way junction 41J.

At the three-way junction 41J of the seal grooves 22 and 41, twice or more application of the sealant cannot be avoided due to the application locus of the sealant, so that the application amount becomes excessive and an overflow amount of the sealant after assembly of the cover 30 increases. In addition, since the three-way junction 41J of the seal grooves 22 and 41 is an application start point or end point when the sealant forming the second seal part 52 is applied, the sealant applied from a nozzle is not stable, and it is difficult to adjust the application amount. Therefore, a seal structure that curbs overflow of the sealant is required.

Furthermore, the three-way junction 41J of the seal grooves 22 and 41 is a part where the connector housing 20, the cover 30, and the base 40 intersect, and is a part where high stress is generated in the sealing material 50 when a twisting force is applied to the connector 21 when the mating connector is inserted into and removed from the connector 21. Therefore, if the application amount is reduced, the reliability of the seal part may be lowered.

In the following description, while "three-way junction" is referred to as the three-way junction (intersection) 50J of the sealing material 50, "three-way junction 50J" can be regarded as the same as "three-way junction 41J" of the seal grooves 22 and 41 unless inconsistent with the context.

The first seal part 51 is formed of a sealant applied to an outer peripheral part of the electronic control unit 1. The second seal part 52 is formed of a sealant applied to the outer peripheral part of the electronic control unit 1, and forms a seal part between the lower surface of the connector housing 20 and the bus 40. The third seal part 53 is formed of a sealant applied to an upper surface side of the connector housing 20, and forms a planar seal between the upper surface of the connector housing 20 and an inner surface part (plane) along the front edge 311 of the top surface 31. Note that a protruding part may be provided on the inner surface part along the front edge 311 of the top surface 31, and the protruding part may be inserted into the seal groove part 221 of the seal groove 22 of the connector housing 20.

The first seal part 51, the second seal part 52, and the third seal part 53 will be described in more detail with reference to FIGS. 2 and 3.

Among the first seal part 51, the second seal part 52, and the third seal part 53 forming the sealing material 50, the third seal part (connector upper seal part) 53 and the first seal part (outer peripheral seal part) 51 are formed after forming the second seal part (connector lower seal part) 52.

As a method of forming the second seal part 52, first, the sealant is applied to the seal groove part 412, the seal groove part 413, and the seal groove part 414 corresponding to the connector lower seal part 52 of the base 40, and then the electronic circuit board 60 on which the connector housing 20 is mounted is assembled to the base 40. At this time, by pushing and spreading the sealant while crushing the sealant on the lower surface (lower seal surface) of the connector housing 20 and the protruding part 23, a gap in the seal grooves 412, 413, and 414 is filled with the sealant, and the second seal part 52 is formed.

In this case, both end parts of the second seal part 52 are located at the three-way junction 50J of the sealing materials 51, 52, and 53, and are located at the three-way junction 41J of the seal groove 22 (222 and 223) and the seal groove 41 (413 and 414).

As the third seal part 53 and the first seal part 51, first, the sealant is applied to the seal groove part 221 on the upper surface part of the connector housing 20 assembled when the second seal part 52 is formed. In addition, the connector housing 20 has the seal groove parts 222 and 223 that descend from the upper surface of the connector housing 20 toward both end parts of the second seal part 52 on both side parts in the width direction W, and the sealant is also applied to the seal groove parts 222 and 223.

Therefore, the third seal part 53 includes an upper surface seal part 531 and side seal parts (inclined seal parts) 533 and 534. As illustrated in FIG. 2, the sealant is applied so that both end parts 533A and 534A of the side seal parts 533 and 534 of the third seal part 53 merge with both end parts of the second seal part 52 at the three-way junction 41J between the seal groove 22 and the seal groove 41.

In addition, from the merging position of the second seal part 52 and the third seal part 53, the sealant is also applied to the outer peripheral part of the base 40 where the second seal part 52 is not formed, and the first seal part 51 is formed. After the sealant of the first seal part 51 is applied, when the cover 30 is assembled to the base 40, the sealant is pushed and spread while being crushed by the seal structure part of the cover 30, whereby the gap in the seal grooves 22, 412, 413, and 414 is filled with the sealant, and the third seal part 53 and the first seal part 51 are formed.

When the application locus of the sealant forming the seal parts 51, 52, and 53 is illustrated, the application locus has a shape as illustrated in FIG. 3. In addition, the seal parts 51, 52, and 53 in FIG. 3 represent the shape of the sealing material formed by solidification of the sealant.

The three-way junction 50J is an intersection point of seal parts where the three seal parts 51, 52, and 53 overlap, and since a plurality of sealants forming the seal parts 51, 52, and 53 overlap, the application amount of the sealant increases. In addition, since the three-way junction 50J is a place which is a starting point or an ending point of the application of the second seal part 52 applied to the lower part of the connector, the application control of the sealant is not stable, and the application amount increases. Therefore, at the three-way junction 50J, an overflow amount of the sealant 50 from the seal groove after the connector housing 20, the cover 30, and the base 40 are assembled increases.

The sealant 50 is formed of a material such as a silicon-based material, an epoxy-based material, or a urethane-based material, and serves as an adhesive.

Hereinafter, embodiments of the seal structure part according to the present invention will be described.

First Embodiment

A first embodiment of the seal structure part of the present embodiment will be described with reference to FIGS. 4A to 4C.

Figure 4A:
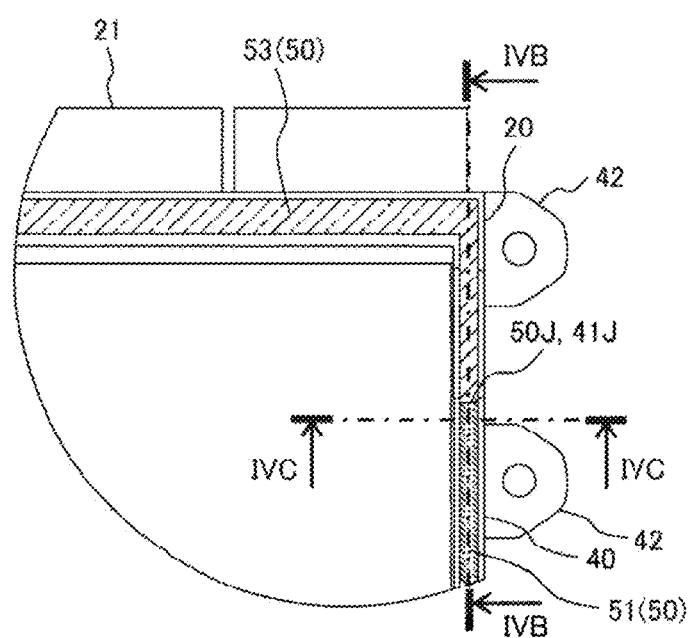
FIG. 4A is a diagram schematically illustrating a seal structure part in a three-way junction according to the first embodiment of the present invention, and is a plan view of the seal structure part as viewed from above.
Figure 4B:
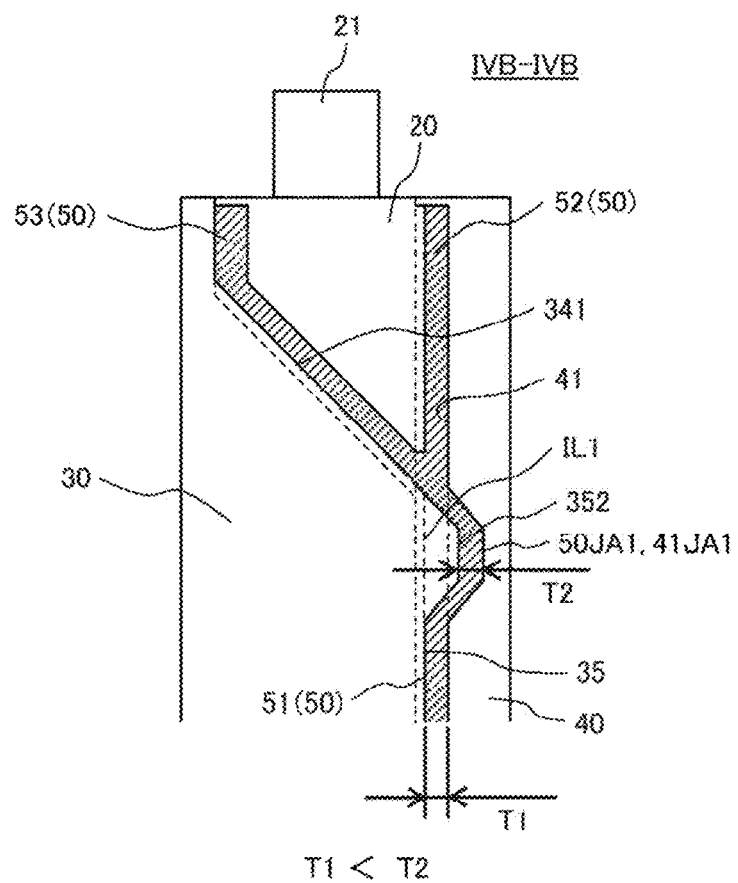
FIG. 4B is a cross-sectional view schematically illustrating a cross section taken along line IVB-IVB of FIG. 4A.
Figure 4C:
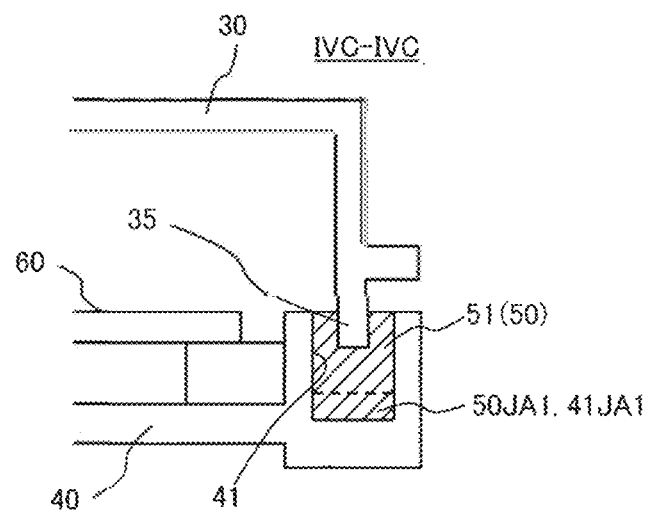
FIG. 4C is a cross-sectional view schematically illustrating a cross section taken along line IVC-IVC of FIG. 4A.

FIG. 4A is a diagram schematically illustrating a seal structure part in a three-way junction 50J according to the first embodiment of the present invention, and is a plan view of the seal structure part as viewed from above. FIG. 4B is a cross-sectional view schematically illustrating a cross section taken along line IVB-IVB of FIG. 4A. FIG. 4C is a cross-sectional view schematically illustrating a cross section taken along line IVC-IVC of FIG. 4A. Configurations similar to those in the above-described embodiment are denoted by the same reference numerals as those in the above-described embodiment, and redundant description will be omitted. Hereinafter, configurations different from those in the above-described embodiment will be described.

A seal groove (recessed part) 41 (413 and 414) of the present embodiment has a recessed part (first recessed part) 41JA1 in which a bottom surface of the seal groove 41 of a base 40 is recessed downward from bottom surface parts of other seal groove 41 parts in a three-way junction 50J. The first recessed part 41JA1 forms a space part (first space part) recessed further from a surface forming the seal groove (recessed part) 41, and forms a groove expansion part (first groove expansion part) expanding the internal space of the seal groove 41. In the present embodiment, the first recessed part 41JA1 expands the seal groove 41 in the depth direction (height direction). The first recessed part 41JA1 is formed on a bottom surface of the seal grooves 413 and 414 and is located on an extension line of seal grooves 222 and 223.

A sealant 50 enters the first recessed part 41JA1 to form a seal expansion part (first seal expansion part) 50JA1.

In the present embodiment, the seal groove (recessed part) 41 is formed in the base 40 so as to be recessed in the thickness direction (height direction H) of the base 40. Then, the first recessed part (space part) 41JA1 is formed in the base 40 so as to be recessed deeper than the recessed part 41 in the thickness direction of the base 40. In this case, the first recessed part (space part) 41JA1 is preferably formed only in an inner part of the recessed part 41 of the base 40 so as to be recessed deeper than the recessed part 41 in the thickness direction of the base 40. As a result, an excessive sealant can be absorbed without increasing the width of the seal groove 41, and the width dimension of an electronic control unit 1 can be reduced.

In the present embodiment, when the amount of the sealant 50 is excessive, the first recessed part 41JA1 serves as a relief part of the excessive sealant, and the first recessed part 41JA1 absorbs the excessive sealant. This curbs overflow of the sealant 50 to the outside of the electronic control unit 1.

In addition, in the present embodiment, it is possible to increase the application amount of the sealant 50 in the seal groove 41 at a three-way junction 50J. When a connector 21 is twisted when a mating connector is inserted into and removed from the connector 21, the highest stress is generated in the three-way junction 50J. By increasing the application amount of the sealing material 50 of the three-way junction 50J, the stress generated in the three-way junction 50J can be reduced.

Further, in the present embodiment, a protruding part 352 to be inserted into the first recessed part 41JA1 is provided at a lower end part 35 of side walls 32 and 34 of a cover 30. As a result, in the three-way junction 50J, the bonding area between the cover 30 and the base 40 by the sealant 50 is increased, and the bonding strength can be improved.

In addition, in the present embodiment, the protruding part 352 is formed such that a seal thickness T2 formed between the bottom surface of the seal groove 41 and the tip end (lower end) of the protruding part 352 is larger than a seal thickness T1 of other parts, so that the excessive sealant can be more reliably absorbed.

That is, in the configuration including the protruding part 352, the electronic control unit 1 is configured as follows. The seal groove (recessed part) 41 is formed in the base 40 so as to be recessed in the thickness direction of the base 40. The first recessed part (space part) 41JA1 is formed in the base 40 so as to be recessed deeper than the recessed part 41 in the thickness direction of the base 40. The cover 30 includes cover main bodies 31, 32, 33, and 34 covering an electronic circuit board 60, and an insertion part 35 inserted into the recessed part 41. The insertion part 35 includes the protruding part 352 to be inserted into the space part 41JA1.

It is also possible to not provide the protruding part 352, and form the lower end part 35 of the side walls 32 and 34 of the cover 30 linearly as indicated by a dotted line IL1.

Second Embodiment

A second embodiment of the seal structure part of the present embodiment will be described with reference to FIGS. 5A to 5C.

Figure 5A:
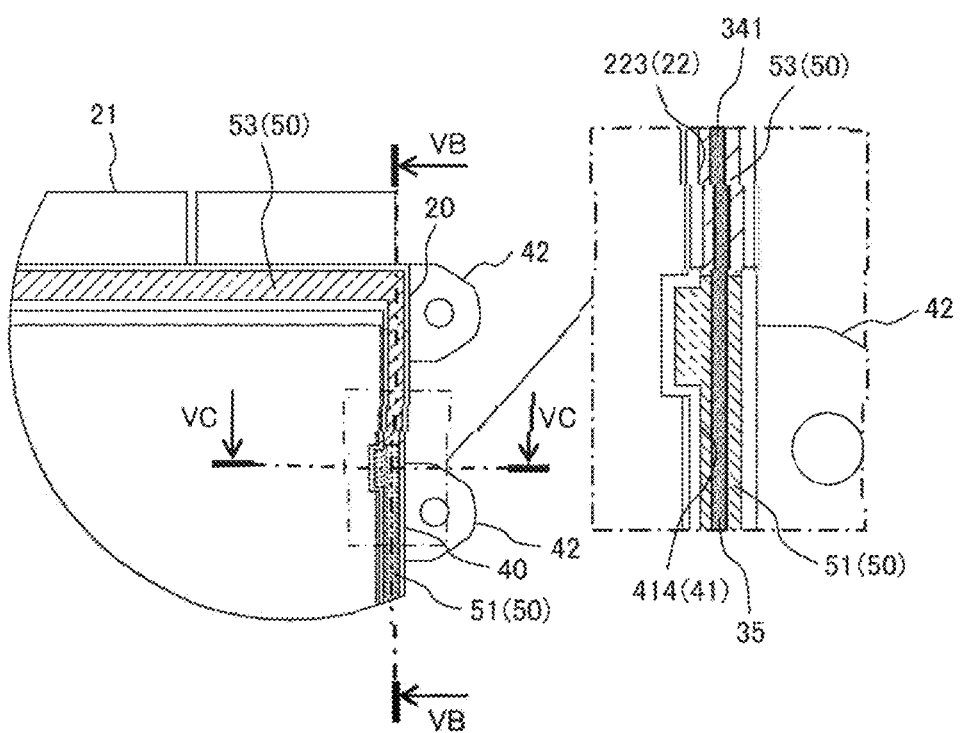
FIG. 5A is a diagram schematically illustrating a seal structure part in a three-way junction according to a second embodiment of the present invention, and is a plan view of the seal structure part as viewed from above.
Figure 5B:
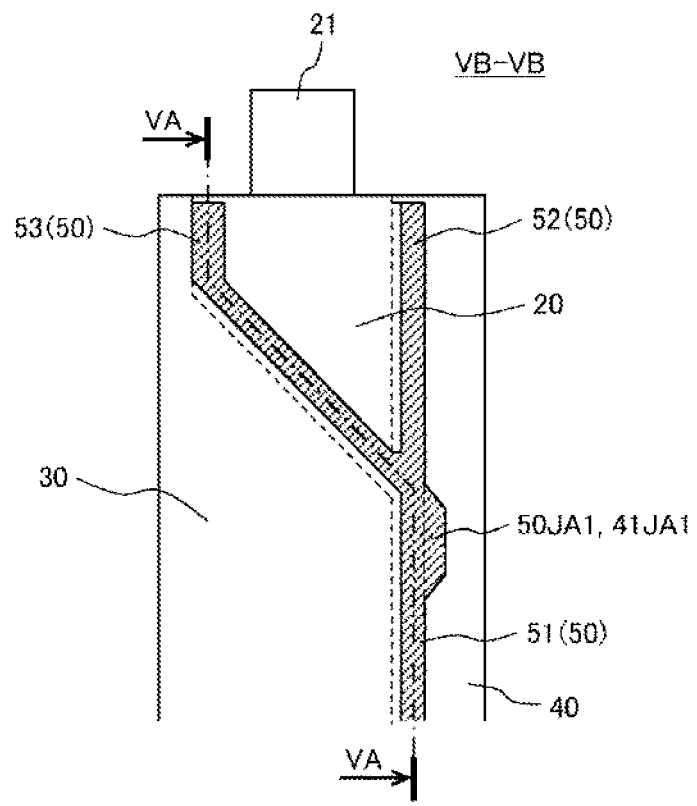
FIG. 5B is a cross-sectional view schematically illustrating a cross section taken along line VB-VB of FIG. 5A.

FIG. 5A is a diagram schematically illustrating a seal structure part in a three-way junction 50J according to the second embodiment of the present invention, and is a plan view of the seal structure part as viewed from above. FIG. 5B is a cross-sectional view schematically illustrating a cross section taken along line VB-VB of FIG. 5A. FIG. 5C is a cross-sectional view schematically illustrating a cross section taken along line VC-VC of FIG. 5A. Configurations similar to those in the above-described embodiment are denoted by the same reference numerals as those in the above-described embodiment, and redundant description will be omitted. Hereinafter, configurations different from those in the above-described embodiment will be described.

A seal groove 41 (413 and 414) of the present embodiment has a recessed part (second recessed part) 41JA2 in which an inner side wall (inner side surface) of the seal groove 41 is recessed in a horizontal direction (lateral direction) toward the inside of an electronic control unit 1 at a three-way junction 50J. The second recessed part 41JA2 forms a space part (second space part) recessed further from a surface forming the seal groove (recessed part) 41, and forms a groove expansion part (second groove expansion part) expanding the seal groove 41 in a groove width direction (lateral direction). In addition, the second recessed part 41JA2 forms an enlarged width part that enlarges the seal groove 41 in the groove width direction.

In the present embodiment, a bottom surface of the second recessed part 41JA2 is configured to have the same depth as bottom surface parts of other seal groove 41 parts. The second recessed part 41JA2 is formed on an inner side surface of the seal grooves 413 and 414, and an extension line of seal grooves 222 and 223 is located on the side of an intersecting position where the extension line intersects with the seal groove 41 (413 and 414).

In the present embodiment, the seal groove (recessed part) 41 is formed in the base 40 so as to be recessed in the thickness direction of the base 40. Then, the second recessed part (space part) 41JA2 is formed in the base 40 so as to be recessed from the inner side surface of the recessed part 41 toward the inside of the base 40.

In the present embodiment, in addition to the first recessed part 41JA1, the second recessed part 41JA2 serves as a relief part for an excessive sealant, and the second recessed part 41JA2 also absorbs the excessive sealant. In this case, the volume of the relief part of the excessive sealant can be increased. The sealant 50 enters the second recessed part 41JA2 to form a seal expansion part (second seal expansion part) 50JA2.

In the present embodiment, the second recessed part 41JA2 is provided together with the first recessed part 41JA1 of the first embodiment. However, the structure may omit the first recessed part 41JA1. In this case, too, the second recessed part 41JA2 can form a relief part of the excessive sealant. Further, by making the bottom surface of the second recessed part 41JA2 the same depth as bottom surface parts of other seal groove 41 parts, a space in the height direction of the electronic control unit 1 is not required, and the dimension (thickness) in the height direction of the electronic control unit 1 can be reduced.

Figure 5C:
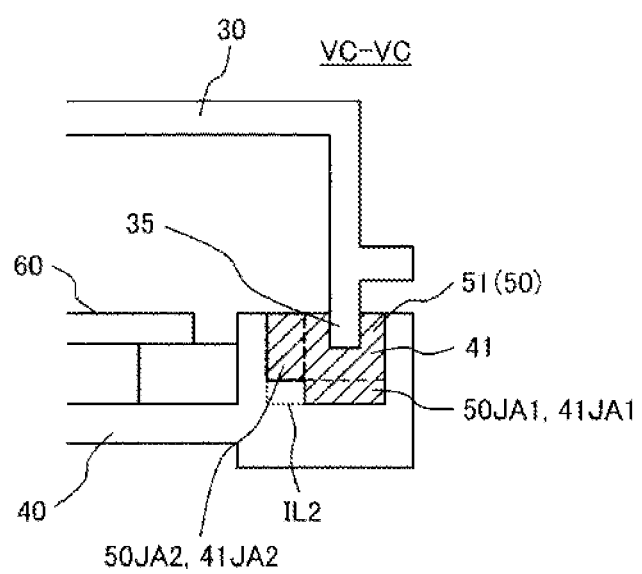
FIG. 5C is a cross-sectional view schematically illustrating a cross section taken along line VC-VC of FIG. 5A.

Note that as indicated by a dotted line IL2 in FIG. 5C, the bottom surface of the second recessed part 41JA2 may be configured to have the same depth as the depth of the bottom surface of the first recessed part 41JA1, so that the volume of the relief part of the excessive sealant becomes larger.

Third Embodiment

A third embodiment of the seal structure part of the present embodiment will be described with reference to FIGS. 6A and 6B.

Figure 6A:
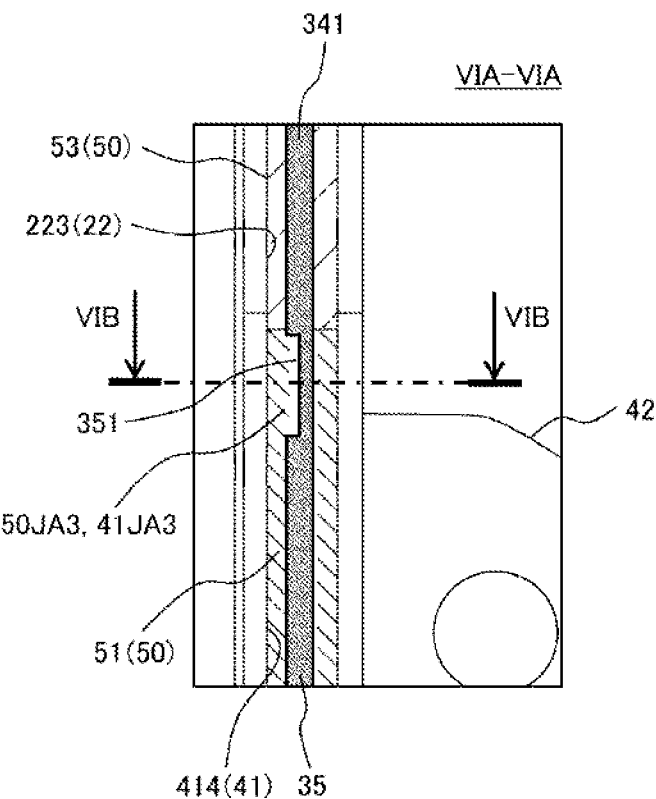
FIG. 6A is a diagram schematically illustrating a seal structure part in a three-way junction according to a third embodiment of the present invention, and is a cross-sectional view of the seal structure part (VIA-VIA cross-sectional view of FIG. 6B).
Figure 6B:
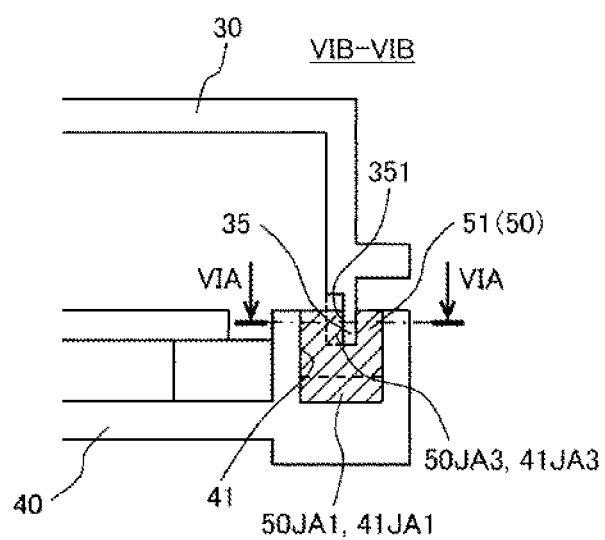
FIG. 6B is a cross-sectional view schematically illustrating a cross section taken along line VIB-VIB of FIG. 6A.

FIG. 6A is a diagram schematically illustrating a seal structure part in a three-way junction 50J according to the third embodiment of the present invention, and is a cross-sectional view of the seal structure part (VIA-VIA cross-sectional view of FIG. 6B). FIG. 6B is a cross-sectional view schematically illustrating a cross section taken along line VIB-VIB of FIG. 6A. Configurations similar to those in the above-described embodiment are denoted by the same reference numerals as those in the above-described embodiment, and redundant description will be omitted. Hereinafter, configurations different from those in the above-described embodiment will be described.

In the present embodiment, a lower end part (lower edge part) 35 of side walls 32 and 34 of a cover 30, which is inserted into a seal groove 41 at a three-way junction 50J, has a third recessed part 41JA3 having a structure in which the thickness is partially reduced. The third recessed part 41JA3 forms a groove expansion part (third groove expansion part) that expands the seal groove 41 in a groove width direction (lateral direction). That is, the third recessed part 41JA3 is formed by a thin part 351 formed in the lower end part 35 of the side walls 32 and 34 of the cover 30 at the three-way junction 50J. The thin part 351 enlarges a space in the seal groove 41.

In the present embodiment, the third recessed part 41JA3 is provided in addition to the first recessed part 41JA1 of the first embodiment. The third recessed part 41JA3, together with the first recessed part 41JA1, serves as a relief part for an excessive sealant, and the third recessed part 41JA3 also absorbs the excessive sealant. In this case, the volume of the relief part of the excessive sealant can be increased. The sealant 50 enters the third recessed part 41JA3 to form a seal expansion part (third seal expansion part) 50JA3.

In the present embodiment, the excessive sealant can be absorbed without increasing the width of the seal groove 41, and the width dimension of an electronic control unit 1 can be reduced.

The third recessed part 41JA3 of the present embodiment is provided together with the first recessed part 41JA1 of the first embodiment. However, the structure may omit the first recessed part 41JA1. In this case, too, the third recessed part 41JA3 can form a relief part for an excessive sealant.

In addition, the third recessed part 41JA3 of the present embodiment may be formed together with the second recessed part 41JA2 of the second embodiment as long as the width dimension of the electronic control unit 1 is not a problem. In this case, the configuration may include all of the third recessed part 41JA3, the second recessed part 41JA2, and the first recessed part 41JA1. In addition, in this case, the configurations described in the first and second embodiments described above can be appropriately adopted as the depth of the seal groove 41 in the first recessed part 41JA1 and the second recessed part 41JA2.

Fourth Embodiment

A fourth embodiment of the seal structure part of the present embodiment will be described with reference to FIGS. 7A and 7B.

Figure 7A:
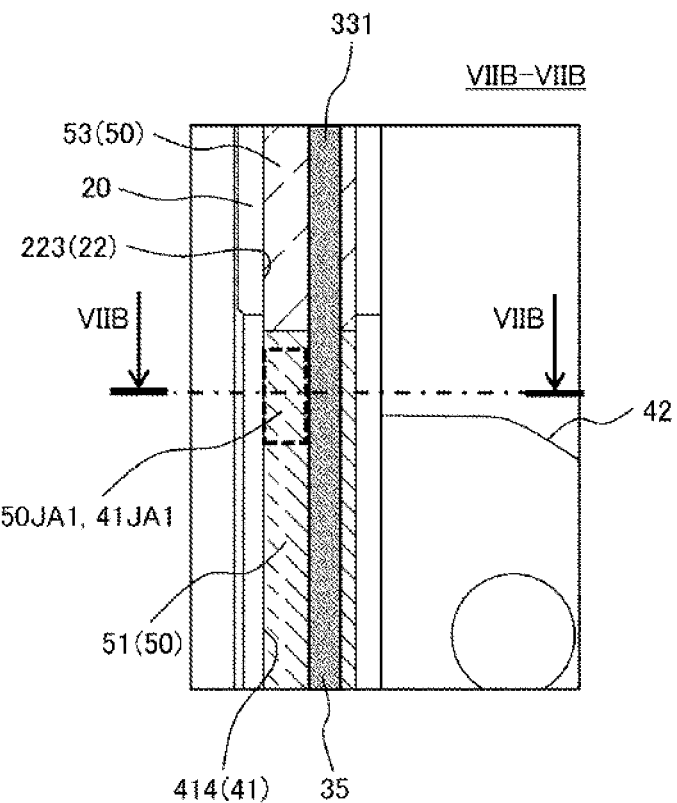
FIG. 7A is a diagram schematically illustrating a seal structure part in a three-way junction according to a fourth embodiment of the present invention, and is a cross-sectional view of the seal structure part (VIIA-VIIA cross-sectional view of FIG. 7B).
Figure 7B:
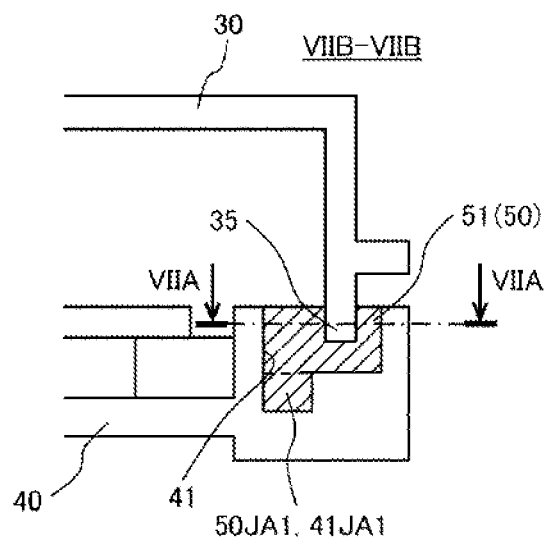
FIG. 7B is a cross-sectional view schematically illustrating a cross section taken along line VIIB-VIIB of FIG. 7A.

FIG. 7A is a diagram schematically illustrating a seal structure part in a three-way junction 50J according to the fourth embodiment of the present invention, and is a cross-sectional view of the seal structure part (VIIA-VIIA cross-sectional view of FIG. 7B). FIG. 7B is a cross-sectional view schematically illustrating a cross section taken along line VIIB-VIIB of FIG. 7A. Configurations similar to those in the above-described embodiment are denoted by the same reference numerals as those in the above-described embodiment, and redundant description will be omitted. Hereinafter, configurations different from those in the above-described embodiment will be described.

The present embodiment has a structure in which the first recessed part 41JA1 of the first embodiment is disposed in a position shifted from a position immediately below a lower end part (seal structure part) 35 of side walls 32 and 34 of a cover 30 toward the inside of an electronic control unit 1 in a seal groove 41.

As in the first embodiment, a sealant 50 enters the first recessed part 41JA1 to form a seal expansion part 50JA1.

In the present embodiment, when the sealant 50 is applied to the seal groove 41 and the cover 30 is assembled, the sealant 50 can be crushed by the lower end part 35 of the side walls 32 and 34 of the cover 30 and a bottom surface of the seal groove 41. That is, as compared with the case where the first recessed part 41JA1 is formed in the entire groove width of the seal groove 41 as in the first embodiment, the interval between the lower end part 35 of the side walls 32 and 34 of the cover 30 and the bottom surface of the seal groove 41 is narrowed, and the effect of crushing the sealant 50 by the lower end part 35 of the side walls 32 and 34 is improved. As a result, in the present embodiment, the property of filling the seal groove 41 with the sealant 50 is improved.

Fifth Embodiment

Figure 8:
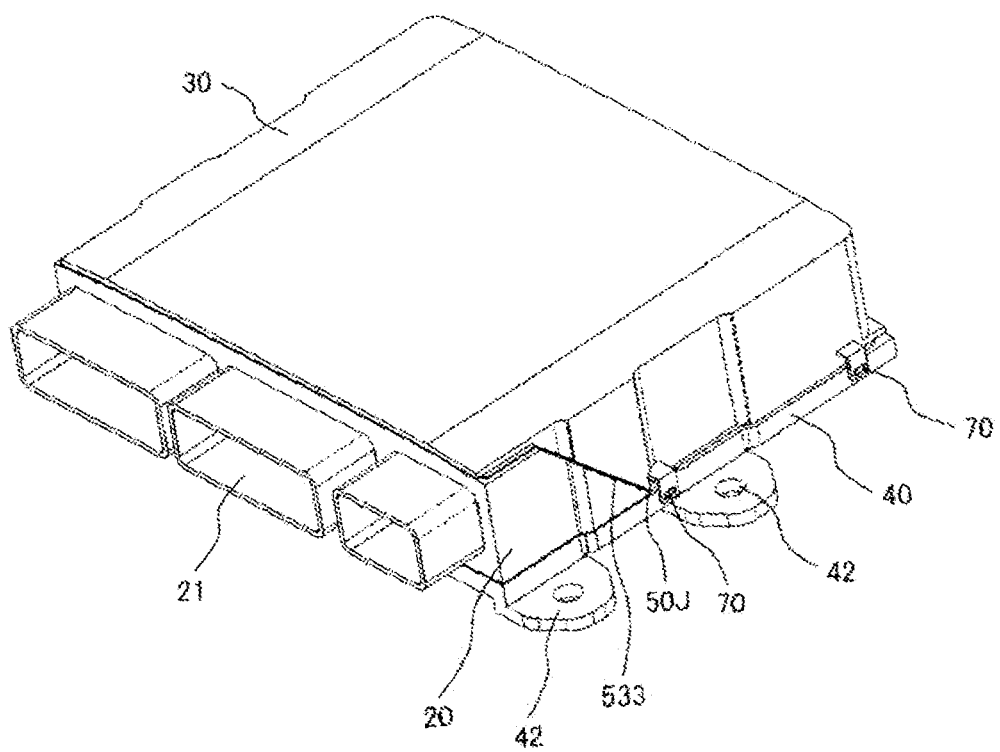
FIG. 8 is a perspective view illustrating an appearance according to a modification of the electronic control unit of FIG. 1.

A fifth embodiment in which the configuration of an electronic control unit 1 is changed will be described with reference to FIG. 8. FIG. 8 is a perspective view illustrating an appearance according to a modification of the electronic control unit 1 of FIG. 1. Configurations similar to those in the above-described embodiment are denoted by the same reference numerals as those in the above-described embodiment, and redundant description will be omitted. Hereinafter, configurations different from those in the above-described embodiment will be described.

The electronic control unit 1 of the present embodiment has, on both side surfaces, fixing parts 70 of a cover 30 in addition to mounting brackets 42 for a vehicle.

That is, the electronic control unit 1 includes the mounting bracket 42 for the vehicle in the vicinity of a part (three-way junction) 50J where a first seal part 51, a second seal part 52, and a third seal part 53 intersect. In addition, the electronic control unit 1 includes the fixing part 70 for fixing the cover 30 to a base 40 in the vicinity of the part (three-way junction) 50J where the first seal part 51, the second seal part 52, and the third seal part intersect.

In the electronic control unit 1, when an overflow amount of a sealant 50 at the three-way junction 50J increases, the overflowed sealant 50 adheres to the mounting bracket 42 and the fixing part 70 of the cover 30. In such a case, the overflowed sealant may interfere with a fixing tool when attaching the electronic control unit 1 to the vehicle, or fixing of the fixing part 70 may be hindered, for example.

These problems can be improved by applying the first recessed part 41JA1, the second recessed part 41JA2, and the third recessed part 41JA3 of each embodiment described above.

In addition, in each of the above-described embodiments, the description has been given assuming that the first recessed part 41JA1, the second recessed part 41JA2, and the third recessed part 41JA3 are provided in both of the two three-way junctions 50J. However, it is also possible to apply the present invention to at least one of the three-way junctions 50J.

The electronic control unit 1 according to each of the above-described embodiments has one of the following configurations (1) and (2).

(1) An electronic control unit includes: a base member 40 that has a recessed part (seal groove) 41 on an outer periphery and an accommodation space for an electronic circuit board 60 formed inside the recessed part 41; a cover member 30 that covers the electronic circuit board 60 and is attached to the base member 40; a connector housing 20 that has a connector 21 and is at least partially accommodated between the base member 40 and the cover member 30; a first seal part 51 that is provided in the recessed part 41 and seals between the base member 40 and the cover member 30; a second seal part 52 that is provided in the recessed part 41 and seals between the base member 40 and the connector housing 20; and a third seal part 53 that is connected to the first seal part 51 and the second seal part 52 and seals between the cover member 30 and the connector housing 20, in which a space part connected to the recessed part 41 and recessed further from a surface forming the recessed part 41 is formed in a part (three-way junction) 50J where the first seal part 51, the second seal part 52, and the third seal part 53 intersect.

Here, the space part includes at least one of a first recessed part 41JA1 and a second recessed part 41JA2.

(2) An electronic control unit includes: a base member 40 that has a recessed part (seal groove) 41 on an outer periphery and an accommodation space for an electronic circuit board 60 formed inside the recessed part 41; a cover member 30 that covers the electronic circuit board 60 and is attached to the base member 40; a connector housing 20 that has a connector 21 and is at least partially accommodated between the base member 40 and the cover member 30; a first seal part 51 that is provided in the recessed part 41 and seals between the base member 40 and the cover member 30; a second seal part 52 that is provided in the recessed part 41 and seals between the base member 40 and the connector housing 20; and a third seal part 53 that is connected to the first seal part 51 and the second seal part 52 and seals between the cover member 30 and the connector housing 20, in which the recessed part 41 is formed in the base member 40 so as to be recessed in a thickness direction of the base member 40, the cover member 30 includes cover main bodies 31, 32, 33, and 34 covering the electronic circuit board 60, and an insertion part 35 inserted into the recessed part 41, and in a part where the first seal part 51, the second seal part 52, and the third seal part 53 intersect, expansion parts (space parts) 41JA1, 41JA2, and 41JA3 expanding an internal space of the recessed part 41 are formed by reducing the thickness of the insertion part 35, forming the recessed part 41 to be low in the depth direction, or forming an inner side surface of the recessed part 41 so as to be recessed toward the inside of the base member 40.

In this case, the part including the space parts 41JA1 and 41JA2 recessed further from the surface forming the recessed part 41 is provided in at least one location. In addition, the part including the expansion parts 41JA1, 41JA2, and 41JA3 is provided in at least one location.

The space parts 41JA1, 41JA2, and 41JA3 form an excessive sealant accommodation part that accommodates an excess of the sealant 50 that fills the recessed part 41. In addition, the part including the space parts 41JA1 and 41JA2 recessed further from the surface forming the seal groove (recessed part) 41, and the part including the space part (expansion part) 41JA3 expanding the internal space of the seal groove (recessed part) 41 are provided in at least one location.

In the present embodiment, the first recessed part 41JA1, the second recessed part 41JA2, and the third recessed part 41JA3 are provided to form a relief part for an excessive sealant. Therefore, the first recessed part 41JA1, the second recessed part 41JA2, and the third recessed part 41JA3 are disposed in the vicinity of a part (three-way junction) 50J where the first seal part 51, the second seal part 52, and the third seal part 53 intersect. In this case, "vicinity" means within a range where an excessive liquid sealant can flow into each of the recessed parts 41JA1, 41JA2, and 41JA3.

Note that the present invention is not limited to the above-described embodiments, and includes various modifications. For example, the above embodiments have been described in detail for the sake of clarity of the present invention, and are not necessarily limited to the embodiments including all of the described configurations. In addition, a part of the configuration of a certain embodiment can be replaced with the configuration of another embodiment, and the configuration of a different embodiment can be added to the configuration of a certain embodiment. In addition, it is possible to add, delete, and replace other configurations for a part of the configuration of each embodiment.

REFERENCE SIGNS LIST 1 electronic control unit
21 connector
30 cover
31 top surface of cover 30 (cover main body)
32, 33, 34 side surface of cover 30 (cover main body)
35 insertion part of cover 30 inserted into recessed part 41
352 protruding part
40 base
403, 404 two sides of base 40
41 seal groove (recessed part)
41JA1 first recessed part (space part)
41JA2 second recessed part (space part)
41JA3 third recessed part (space part)
42 mounting bracket
50 sealing material (seal part)
50J three-way junction of seal member
51 first seal part
52 second seal part
53 third seal part
60 electronic circuit board
70 fixing part for fixing cover 30 to base 40

The invention claimed is:

1. An electronic control unit comprising:
a base member that has a recessed part on an outer periphery and an accommodation space for an electronic circuit board formed on the inner peripheral side of the recessed part;
a cover member that covers the electronic circuit board and is attached to the base member by inserting a lower end of a side wall into the recessed part;
a connector housing that has a connector and is at least partially accommodated between the base member and the cover member;
a first seal part that is provided in the recessed part and seals between the base member and the cover member;
a second seal part that is provided in the recessed part and seals between the base member and the connector housing; and
a third seal part that is connected to the first seal part and the second seal part and seals between the cover member and the connector housing, wherein
the recessed part has a space part that is connected to the recessed part and is recessed further from a surface forming the recessed part in a part where the first seal part, the second seal part, and the third seal part intersect,
the recessed part is formed in the base member so as to be recessed in a thickness direction of the base member, and
the space part is formed in the base member so as to be recessed deeper than the recessed part in the thickness direction of the base member, and is disposed in a position within the recessed part that is shifted toward the inside of the base member with respect to the lower end of the side wall of the cover member.

2. The electronic control unit according to claim 1, wherein the space part accommodates an excess of a sealant forming the first seal part, the second seal part, and/or the third seal part that fills the recessed part.

3. The electronic control unit according to claim 1, wherein
the electronic control unit has a rectangular shape when viewed in a vertical direction, and
a part where the first seal part, the second seal part, and the third seal part intersect is provided on two surfaces on both sides of a surface on which the connector is mounted among four side surfaces of an outer periphery of the electronic control unit.

4. The electronic control unit according to claim 1 further comprising a mounting bracket for a vehicle in the vicinity of a part where the first seal part, the second seal part, and the third seal part intersect.

5. The electronic control unit according to claim 1 further comprising a fixing part for fixing the cover member to the base member in the vicinity of a part where the first seal part, the second seal part, and the third seal part intersect.

6. The electronic control unit according to claim 1, wherein a part including the space part recessed further from a surface forming the recessed part is provided in at least one location.

\* \* \* \* \*